July 22, 1958 L. D. McMULKIN 2,844,807

ELECTRON TUBE SOCKET OR THE LIKE FOR PRINTED CIRCUITS

Filed Jan. 11, 1955 2 Sheets-Sheet 1

INVENTOR.
LORNE D. McMULKIN
BY [signature]
ATTORNEY

ELECTRON TUBE SOCKET OR THE LIKE FOR PRINTED CIRCUITS

Filed Jan. 11, 1955 2 Sheets-Sheet 2

INVENTOR.
LORNE D. McMULKIN
BY
H. W. Newton
ATTORNEY

United States Patent Office 2,844,807

Patented July 22, 1958

2,844,807

ELECTRON TUBE SOCKET OR THE LIKE FOR PRINTED CIRCUITS

Lorne D. McMulkin, Camden, N. J., assignor to Radio Corporation of America, a corporation of Delaware Application January 11, 1955, Serial No. 481,141

The terminal fifteen years of the term of the patent to be granted has been disclaimed 7 Claims. (Cl. 339—193)

This invention relates to printed circuit structures for electronic equipment, and more particularly to tube and like socket mounting structures adapted to be mechanically and electrically interconnected with printed circuit structures.

In order to save space in electronic equipment with printed circuit structures or boards, it is desirable to mount electron tubes and like equipment with the longitudinal axes thereof parallel with the structure or the plane of the board. This allows printed circuit structures to be mounted closer together thereby affecting a saving in space without impairing the ventilation of the structure. Also, with commonly used multpin sockets mounted in a conventional manner in a printed circuit board, it is often necessary to use physical jumper wires at certain points in the circuit because crossover connections cannot be made by printed means. Elimination of the jumper wires greatly simplifies the construction of electronic equipment and effects savings in costs.

Accordingly, it is an object of this invention to provide a socket mounting structure for electron tubes and the like which provides operative circuit connections with printed circuit structures or boards with the longitudinal axes of the socket element parallel to the board.

It is another object of the present invention to provide a socket mounting structure adapted to be interconnected to a printed circuit board allowing insertion of electron tubes and the like into the socket element thereof with the longitudinal axes of the electron tube or like equipment parallel to the printed circuit board.

It is yet a further object of the present invention to provide a socket mounting structure adapted to be interconnected to a printed circuit structure or board that permits printed circuit connections to all of the socket leads without the use of "jumper" wires.

These and other objects of the present invention are achieved, in general, by providing a plurality of printed circuit mounting elements fixed in parallel space relation. Each of the elements has a number of apertures arranged therein to receive the parallel lead elements of a socket adapted to receive the terminal pins of electron tubes and like equipment. Lead elements associated with a socket are mechanically and electrically fastened to printed circuit conductors on the mounting elements. Each mounting element has a plurality of connecting staples protruding from and affixed to one edge of the element. Each staple is electrically and mechanically connected to the above mentioned printed circuit conductors on the elements, and thus to one of the lead elements of the socket. The staples provide mechanical and electrical interconnection between the mounting elements and a main printed circuit board.

However, the invention, both as to its organization and operation, will be best understood when the following description is read in connection with the accompanying drawings, in which.

Figures 1, 2, 3, 4:
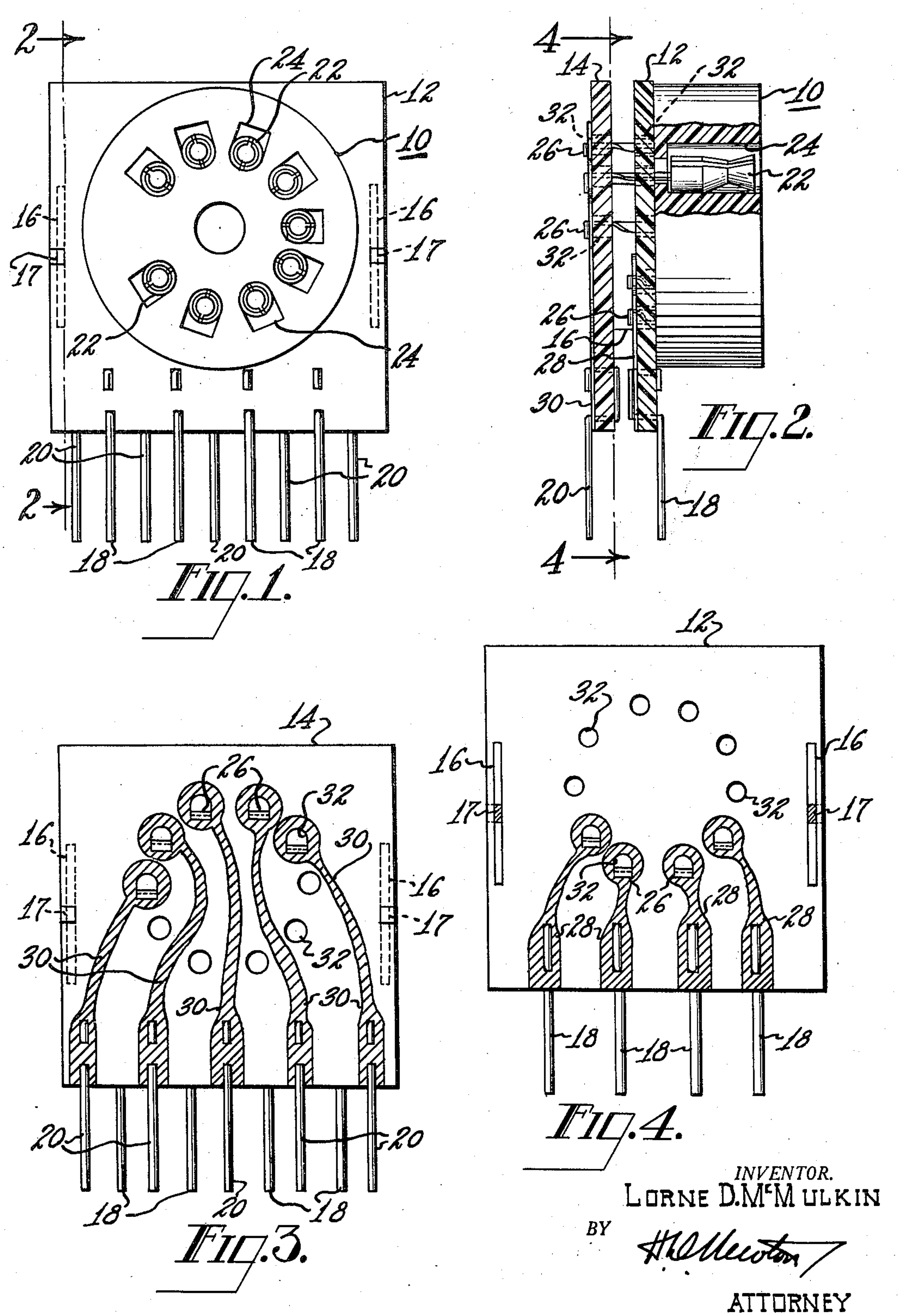
Figure 1 is a front elevational view of a tube socket and mounting elements illustrating one embodiment of the present invention.
Figure 2 is a side sectional view of the tube socket and mounting elements shown in Figure 1 taken through line 2—2.
Figure 3 is a rear elevational view of the tube socket and mounting elements of Figure 1.
Figure 4 is a rear sectional view of the tube socket and mounting elements taken through line 4—4 of Figure 2.

Referring now to Figures 1, 2, 3 and 4, a tube socket mounting structure in accordance with the present invention includes a socket 10, in this case a nine pin tube socket, having the longitudinal axes thereof mounted perpendicularly to a first printed circuit mounting element or board 12.

"Printed circuit" means any set of planar conductors, or components, or both, bonded to an insulating board or sheet and adapted to replace wire conductors or separate components or both in an electrical circuit. A "printed conductor," of course, means any planar conductor bonded to an insulating board. The conductors and components can be affixed to the insulating material in whatever manner desired, such as, by printing, silk screening, photo etching, or any of the other known processes.

A second mounting board 14 is held in parallel spaced relation to the first mounting board 12 by a pair of spacer elements 16 mounted between opposite edges of the mounting boards 12 and 14. The spacer elements 16 are held to the mounting boards 12 and 14 in any suitable manner, such as by lugs 17 on opposed sides of the spacer element 16 adapted to project through the mounting boards 12 and 14 and crimp over the edges of the apertures to hold the boards in place.

A first set of four elongated staple terminals 18 are fastened parallel to each other along the lower edge of the first mounting board 12, and project from the board 12 perpendicularly to the lower edge. A second set 20 of five staple terminals are mounted in a like manner on the second mounting board 14. It will be noticed from Figure 1 that the staple terminals 20 of the second board 14 are not mounted directly behind the staple terminals 18 but are staggered between the terminals 18 when viewed from the front or the rear of the structure.

The tube socket has nine elongated pin receptacles 22 mounted in nine longitudinal apertures 24 in the tube socket 10 in the usual manner. The lead elements 26 of the pin receptacles 22 project through the rear of the socket 10 and through apertures 32 in the first mounting board 12 arranged in a pattern to match the pattern with which the lead elements 26 project from the socket 10, and some of them project through apertures 32 in the second mounting board 14 arranged in a manner similar to that of the apertures in the first board 12.

As can be seen from the drawings, the four lead elements 26 are bent over to contact printed conductors 28 on the back of the first mounting board 12. The lead elements 26 are electrically connected to the printed conductors 28 in any suitable manner, such as dip soldering. The remaining lead elements 26 are similarly connected to printed conductors 30 on the back of the second mounting board 14. The connections of the pin receptacle lead elements 26 to the printed conductors 28 and 30 is most clearly shown in Figures 3 and 4.

The two sets of staples 18 and 20 are electrically connected to the printed conductors 28 and 30 in any suitable manner, such as by dip soldering. The staples 18 and 20 not only serve as electrical connections to the tube socket 10, but also serve as a means to physically and mechanically interconnect the tube socket and mounting structure to a main printed circuit board, as will be more fully explained hereinafter.

It can be readily seen that the tube socket and mounting elements when assembled will form a unitary structure that has the staple terminals 18 and 20 projecting therefrom.

As was stated before, electrical connections are made between the lead elements 26 and the printed conductors 28 and 30 on the boards 12 and 14 in any suitable manner, such as, by a dip soldering process. If a dip soldering technique is used, the four lead elements 26 in Figures 1, 2, 3 and 4 are first dip soldered to the printed conductors 28 on the first mounting board 12, and then the five lead elements 26 are dip soldered to the printed conductors 30 on the second mounting board 14.

Figure 6:
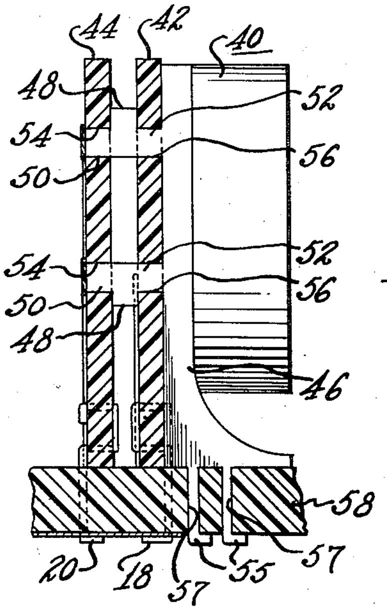
Figure 6 is a side sectional view of the tube socket and mounting structure shown in Figure 5 taken through line 6—6.

The mounting of the entire structure to a main printed circuit board or structure 58, as shown in Figure 6, is accomplished by inserting the staple terminals 20 and 18 into properly positioned apertures in the printed circuit board. The portion of the staples that project through the board are bent over and electrically connected to printed conductors on the main printed circuit, such as by dip soldering. This interconnection is shown in Figure 6.

It will be noticed that when a nine pin tube socket is used as in Figures 1 to 4, each of the mounting boards has ten apertures 32 equally spaced in a circle around the mounting boards 12 and 14, as shown. This permits mounting the tube socket 10 on the boards 12 and 14 in any one of 10 angular positions, that is, the blank position on the tube socket that has no pin connection (the blank connection being on the left of the drawing in Figure 1) can be rotated to any position to correspond to the type of circuit wiring that may be desired or necessary to eliminate the use of "jumper" wires to cross over a printed conductor on the main printed circuit board.

Figure 5:
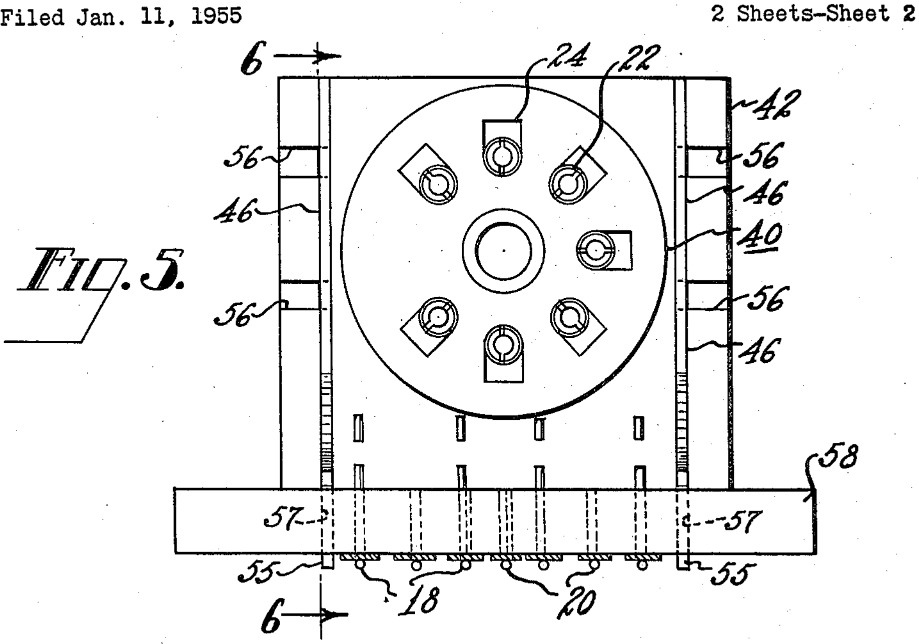
Figure 5 is a front elevational view of a tube socket and mounting structure illustrating a further embodiment of the present invention, and showing a printed circuit board, illustrating the manner in which this and the other structures are used in accordance with the invention.

Referring now to Figure 5, a tube socket and mounting structure according to a further embodiment of the present invention again includes a tube socket 40, in this case shown as having only 7 pins, mounted to a first mounting board 42 and a second mounting board 44 in a manner similar to that shown in connection with Figures 1, 2, 3 and 4.

The construction of the boards 42 and 44 and the method of mounting them with respect to the socket 40 is identical to that hereinbefore described in connection Figures 1, 2, 3 and 4, with the exception that the mounting boards are held in spaced relation by a pair of metallic brackets 46 instead of the spacer elements 16.

The brackets 46 are designed to accomplish two purposes: (1) to hold the mounting boards 42 and 44 in spaced relation and; (2) to provide a strengthing element for the tube socket mounting.

As will be seen with reference to Figure 6, bracket 46 is in the shape of a capital L having two T-shaped lugs 48 projecting perpendicularly from the long side of the L. The lugs 48 each have a first reduced width portion 50 at the end of the lug remote from the bracket itself, and a second reduced width portion 52 adjacent the bracket 46. The first reduced width portions 50 fit into apertures 54 in the second mounting board 44. Slots 56 in the first mounting board 42 are designed to fit over the second reduced width portions 52 of the bracket 46. The T-shaped lugs 48 thus hold the mounting boards in spaced relation to each other and hold the bracket 46 rigidly to the mounting boards.

Each bracket 46 further has a pair of prongs 55 projecting downwardly from the short side of the L and which are adapted to project through apertures 57 in a main printed circuit structure or board 58 and to be crimped over along with the staple terminals 18 and 20 as shown in Figures 5 and 6 to more firmly hold the socket and mounting structure to the main structure. As can be readily seen, the bracket structure 46 connected both to the mounting boards 42 and 44 and to a main printed circuit board 58 will aid to greatly strengthen the connection between the tube socket, mounting structure, and the main printed circuit board. If desired, to further strengthen the connection, special copper surfaces, not connected to any electrical circuit, may be provided on the main structure to contact and be soldered to the prongs of the bracket 46. Too, the bracket 46 may be used as an auxiliary grounding connection in some applications.

It is readily apparent that if complicated interconnections must be made to the socket or if the socket has a large number of connections, additional mounting boards may be used to increase the number of connections that can be made to the socket without undue complication.

A socket mounting structure according to the invention provides an inexpensive and rugged socket mounting means allowing an electron tube or like equipment adapted to be used therewith to be mounted in parallel relation with the main printed circuit board. The mounting structure will also permit printed circuit connections to the terminals of the socket without the use of "jumper" wires or other cumbersome interconnecting expedients.

What is claimed is:

1. A mounting structure for electronic tubes and like plug-in devices adapted to be connected with a printed circuit, comprising in combination, a socket element having spaced elongated pin contact receptacles for establishing electrical connections, a plurality of parallel spaced mounting boards having a plurality of printed conductors thereon, means mechanically and electrically connecting said receptacles to said printed conductors with said receptacles at substantially right angles to said boards, and extended terminal means for electrically connecting said printed conductors with a printed electrical circuit on a printed circuit board and for mechanically mounting and holding said mounting structure wherein said mounting boards are substantially at right angles to said printed circuit board 2. A mounting structure for electron tubes and like plug-in devices adapted to be connected with a printed circuit, comprising in combination, a socket element adapted to operatively receive the terminal pins of an electrical component in spaced elongated pin contact receptacles for establishing electrical connections, a plurality of parallel spaced mounting boards having a plurality of printed conductors thereon, means mechanically and electrically connecting each of said receptacles to a printed conductor on said boards with said receptacles substantially at right angles to said boards, and grouped terminal means extending from said mounting boards for connecting said printed conductors to a printed electrical circuit on a printed circuit board and for supporting said mounting structure to position said mounting boards at substantially right angles to said printed circuit board.

3. An electron tube mounting structure adapted to interconnect an electron tube with a main printed circuit board with the longitudinal axis of said tube substantially parallel to the plane of said printed circuit board, comprising in combination, a tube socket adapted to operatively receive the connecting pins of an electron tube in spaced elongated pin contact receptacles, a plurality of parallel spaced mounting boards having a plurality of printed conductors thereon, means for mechanically and electrically connecting said receptacles to said printed conductors with said receptacles substantially at right angles to said boards, and grouped terminal means for electrically connecting said printed conductors to a printed electrical circuit on said main printed circuit board and for supporting said mounting structure to position said mounting boards at substantially right angles to said main board.

4. An electron tube mounting structure adapted to interconnect an electron tube with a printed circuit board with the longitudinal axes of said electron tube parallel with the plane of said printed circuit board, comprising in combination, a tube socket adapted to operatively receive the terminal pins of an electron tube in spaced elongated contact pin receptacles, a plurality of parallel spaced mounting boards having a plurality of printed conductors thereon, means for mechanically and electrically connecting each of said receptacles to a printed conductor on said mounting boards with said receptacles substantially at right angles to said boards, and means for securing said mounting structure to a printed circuit board, said means being adapted for connecting said printed conductors to a printed electrical circuit on said printed circuit board and for securing said mounting boards at substantially right angles to said printed circuit board.

5. An electron tube mounting structure as defined in claim 4 wherein said last named means includes elongated terminals affixed to adjacent edges of said mounting boards and electrically connected to the printed conductors thereon and extending coextensively parallel from said mounting board in the plane of said boards.

6. A unitary electrical mounting structure adapted to interconnect an electron tube and like plug-in devices with a printed circuit board wherein the longitudinal axis of the plug-in device is parallel with the plane of the printed circuit board, comprising in combination; a first and a second mounting board of insulating material fixed in parallel spaced relationship to each other and having a plurality of printed conductors thereon: a connection socket adapted to receive an electrical plug-in device and having spaced elongated pin receptacles fixed in parallel spaced relationship to each other for engaging terminal pins of said device; means for electrically connecting part of said receptacles to said printed conductors on the first of said mounting boards and the remainder of said receptacles to printed conductors on the second of said mounting boards with said pin receptacles perpendicular to said mounting boards; and means including staple terminals fixed rigidly to and extending from adjacent edges of said mounting boards for connecting said printed conductors to an electrical circuit on said printed circuit board and for securing said mounting boards at right angles to said printed circuit board.

7. An electron tube mounting structure adapted to interconnect an electron tube with a printed electrical circuit on a printed circuit board with the longitudinal axes of the electron tube parallel with the plane of said printed circuit board, comprising in combination; a tube socket adapted to operatively receive the terminal pins of an electron tube in spaced elongated pin contact receptacles fixed in parallel spaced relationship to each other within said tube socket; said pin contact receptacles having lead elements which extend from said tube socket in spaced parallel relationship to each other; two mounting boards of an electrical insulating material having a plurality of printed conductors thereon and a plurality of apertures therein arranged to allow said lead elements of said pin receptacles to project therethrough; means for mechanically and electrically connecting through a portion of said apertures a part of the number of said lead elements to the printed conductors on one of said mounting boards and for connecting through other of said apertures the remainder of said lead elements to the printed conductors on the other of said mounting boards with said pin receptacles perpendicular to said mounting boards; and means including terminals mechanically and electrically connected respectively to said mounting boards and said printed conductors extending coextensively parallel from said mounting boards along adjacent parallel edges thereof for connecting said printed conductors to a printed electrical circuit on said printed circuit board and for securing said mounting boards at right angles to said printed circuit board.

References Cited in the file of this patent

UNITED STATES PATENTS

| | | |
|---|---|---|
| 2,424,986 | Hubbell et al. | Aug. 5, 1947 |
| 2,474,988 | Sargrove | July 5, 1949 |
| 2,492,236 | Mydlil | Dec. 27, 1949 |
| 2,650,267 | Walters | Aug. 25, 1953 |
| 2,693,584 | Pifer | Nov. 2, 1954 |